United States Patent [19]

Bernitz

[11] 4,336,509

[45] Jun. 22, 1982

[54] OSCILLATION GENERATOR FOR AN ULTRASONIC LIQUID ATOMIZER

[75] Inventor: Franz Bernitz, Anzing, Fed. Rep. of Germany

[73] Assignee: Bosch-Siemens Hausgeräte GmbH, Stuttgart, Fed. Rep. of Germany

[21] Appl. No.: 122,596

[22] Filed: Feb. 19, 1980

[30] Foreign Application Priority Data

Feb. 20, 1979 [DE] Fed. Rep. of Germany ....... 2906499

[51] Int. Cl.[3] ......................... B05B 17/06; H03B 5/36

[52] U.S. Cl. .................................... 331/114; 239/102; 331/116 R

[58] Field of Search ............. 331/116 R, 116 FE, 158, 331/159, 114; 239/102; 366/116; 310/314, 317; 318/114, 130; 340/384 E

[56] References Cited

U.S. PATENT DOCUMENTS

| | | | |
|---|---|---|---|
| 3,813,616 | 5/1974 | Antonevich | 331/116 R |
| 3,967,143 | 6/1976 | Watanabe et al. | 331/116 R X |
| 4,044,297 | 8/1977 | Nobue et al. | 331/116 R X |
| 4,264,837 | 4/1981 | Gaboriaud | 239/102 X |

FOREIGN PATENT DOCUMENTS

| | | |
|---|---|---|
| 2129665 | 12/1972 | Fed. Rep. of Germany . |
| 2524862 | 12/1975 | Fed. Rep. of Germany . |

*Primary Examiner*—Siegfried H. Grimm

*Attorney, Agent, or Firm*—Herbert L. Lerner; Laurence A. Greenberg

[57] ABSTRACT

The oscillation generator includes an oscillator circuit, a push-pull amplifier with inductive positive feedback connected in the circuit, a piezoceramic atomizer vibrator element, and a load-dependent regenerative feedback coupling connected to the circuit. The coupling is in the form of a tunable frequency-selective sensor having outputs connected to the inputs of the amplifier.

10 Claims, 2 Drawing Figures

OSCILLATION GENERATOR FOR AN ULTRASONIC LIQUID ATOMIZER

Figure 1:
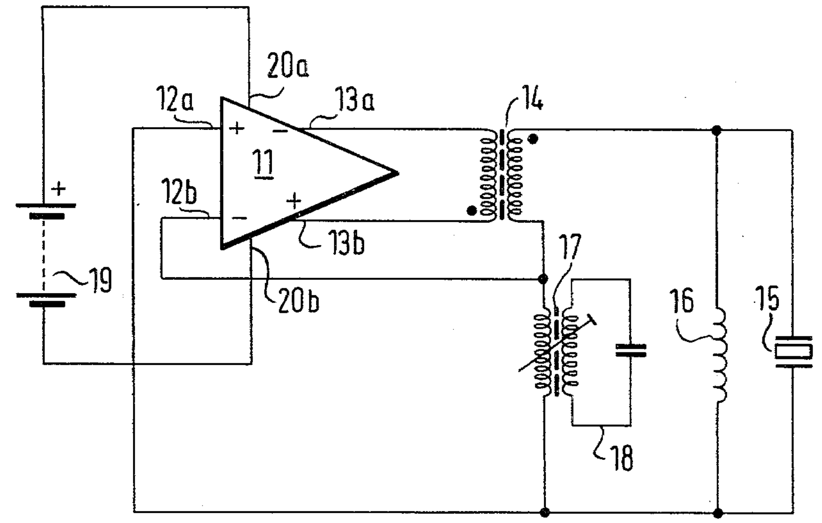

The invention relates to an oscillation generator for an ultrasonic liquid atomizer, including a push-pull oscillator circuit containing an amplifier with inductive positive-feedback, and a piezoceramic atomizer element.

Such oscillation generators for an ultrasonic liquid atomizer find application in inhalation equipment, fuel atomizing systems, air humidifiers, ink atomizers and similar devices. They may include, for instance, a separate oscillator and matching circuit for the piezoceramic atomizer element which does not influence the hereinafore-mentioned parts of the circuit or, on the other hand, this atomizer element, due to its selectivity properties, can be part of the oscillator and matching circuit.

Vibration generators for an ultrasonic liquid atomizer, as they are customarily constructed at present, are described in German Published, Non-Prosecuted Patent Applications Nos. DE-OS 25 24 862 and DE-OS 21 29 665. Such circuits work with operating voltages of about 40 V, derived from the line voltage (220/110 V). They require many parts and sometimes special vibrator constructions. If the load changes, detuning of the vibration generators occurs in operation relative to the atomizer resonance of the piezoceramic atomizer element, which leads to a cessation of the oscillation of the vibration generator or prevents reliable starting of the generator in the starting phase. It is likewise possible, as well as undesirable, to excite other vibration modes of the atomizer element which are not suitable for the atomizing process and interfere with the safe handling of a liquid atomizer.

To counter these detrimental properties, it is an object of the invention to provide an oscillation generator for an ultrasonic liquid atomizer which overcomes the hereinafore-mentioned disadvantages of the heretofore-known devices of this general type, and to provide a circuit which starts up reliably at low operating voltages, is detuned only inappreciably (for instance, less than 5% ) under load, gets along with few active and passive components, is excited exclusively at the atomizer resonance and is suitable for battery or storage cell operation.

With the foregoing and other objects in view there is provided, in accordance with the invention, an oscillation generator for an ultrasonic liquid atomizer, comprising a push-pull oscillator circuit including an amplifier with inductive positive feedback, a piezoceramic atomizer vibrator element, and tunable frequency-selective sensor means in the power supply circuit of the vibrator for driving the amplifier with positive feedback in phase with the load current flowing through the sensor when in the tuned condition.

This construction achieves the result that through the phase relationship brought about by the positive-feedback transformer and the loop gain produced in the amplifier and the sensor, the oscillation condition is fulfilled for this one frequency of the oscillation generator circuit, which is band-limited by the selective sensor and is possible in the piezoceramic atomizer; but that other modes of vibration which are equally possible for the piezoeceramic atomizer element, are attenuated. The oscillation generator circuit therefore oscillates only at the desired frequency, band-limited by the selective sensor organ, if a resonance frequency or mode also exists which could be more easily excited without these selection means adjacent to the atomizer frequency but outside the selectivity range of the sensor.

In accordance with another feature of the invention, the amplifier includes difference inputs and difference outputs and the sensor means is a parallel-resonance circuit, and including a positive-feedback transformer having a primary side connected as a balanced load to the outputs of the amplifier and a secondary side, and a selective circuit loading the secondary side of the positive-feedback transformer, said selective circuit including the piezoceramic atomizer element and a resonant transformer having a primary and secondary side, the parallel-resonance circuit being connected in series with the selective circuit and coupled to the resonant transformer, the difference inputs of the amplifier being driven by feedback voltage from across the primary side of the resonant transformer in push-pull for exciting the oscillation.

Thus, an operationally reliable oscillation generator circuit containing a piezoceramic atomizer element is obtained with few parts. For the construction of the positive-feedback transformer, transformer ratios of, for instance, about 1:18 have been found advantageous and for the Q of the parallel resonance circuit a value of about 50, so that the circuit starts reliably and is detuned only inappreciably from the desired frequency under load. A special construction of the atomizer element for deriving the positive feedback voltage is not necessary therefor. The positive feedback condition for exciting oscillation is obtained by the appropriate polarity (coupling in a sense opposite to that of the input winding) of the positive-feedback transformer.

In accordance with a further feature of the invention, there is provided a matching choke shunted across the atomizer element for improving the properties for low supply voltages.

For low supply voltages or voltage sources with low internal resistance, the matching choke shunted across the atomizer element becomes more important because the large load currents of the oscillator circuit connected to the finite internal resistance of the driver circuit with its voltage source leads to voltage breaks at resonance. With this choke, a vibration mode closely adjacent to the atomizer resonance with series resonance character is shifted with parallel resonance character in such a manner that it is outside the band width of the current sensor which it would otherwise influence; it also turns out to be more important here that resonance peaking in the atomizer mode also takes place in the case of voltage breaks.

In accordance with an added feature of the invention, the frequency of the generated oscillation is determined with band limitation by the parallel-resonance circuit and the parallel resonance circuit is tuned to the atomizer frequency of the piezoceramic atomizer element.

This improves the oscillation generator constructed in this manner with respect to operational reliability in atomizer operation. This assures reliable starting and reliable operation of the circuit at the atomizer resonance, from which it scarcely deviates even under load. Deviation of the oscillation generator to another vibration mode of the atomizer element is thereby prevented. The parallel-resonance circuit which is connected into the supply circuit of the piezoceramic vibrator through an autotransformer, a potential-isolating transformer or capacitive coupling, can be tuned capacitively or inductively, or the tuning can include a combination of both methods. This minimizes the adjustment work with the most advantageous method for the balancing of one element if a vibrator is exchanged. Due to the small number of trouble-prone components and adjusting elements, the reliability and insensitivity to trouble of the vibration generator, is increased.

In accordance with an additional feature of the invention, the amplifier is in the form of a differential amplifier circuit including two transistors, the collectors of the transistors forming the difference outputs connected across the primary side of the positive-feedback transformer, and the positive-feedback transformer having a center tap connected to a supply voltage. In this manner an oscillation generator can be constructed with a minimum of components; because of its push-pull arrangement, low operating voltages are sufficient and due to its symmetrical construction it is very reliable in operation. If one wishes to dispense with its symmetrical construction, a circuit arrangement is likewise possible in which only one collector is loaded by the primary side of the positive-feedback transformer.

In accordance with yet another feature of the invention, there are provided two diodes poled together in the cutoff direction against a fixed potential, the diodes being connected between the bases of the transistors for balancing the amplifier drive through rectification of part of the positive feedback voltage and for obtaining the base control current.

This arrangement further prevents lengthening of the switching times due to charge accumulations in the base zones of the transistors.

In accordance with yet a further feature of the invention, the fixed potential is a supply voltage source, and there is provided a common emitter point connected to the emitters of the transistors, to the supply voltage and to the diodes, and a series resistor connected between the supply voltage and the bases of the transistors which are driven in push-pull for supplying residual current to the bases.

It is rather unimportant here whether the base resistor provided for starting the circuit is made symmetrical for both bases of the differential amplifier, is provided symmetrically through a center tap of the primary side of the resonant transformer for the parallel tuned circuit, or is fed asymmetrically to any desired point of the base circuit. A self-contained base supply of the differential amplifier is provided in the generator operation by the circuit arrangement of the diodes, always poled in the cutoff direction, which obtains the base current of the transistors through rectification of the fed-back part of the oscillator signal.

In accordance with yet an added feature of the invention, the supply voltage is at least in the order of 1 volt.

In accordance with yet an additional feature of the invention, the transistors are Si transistors.

If supply voltages in the order of 1 V are sufficient for the amplifier portion of the oscillation generator, such as is the case for a differential amplifier of the type described hereinbefore, the ultrasonic liquid atomizer works from an operating voltage of 1 V on, which is of great importance for battery-operated equipment or for operation with storage cells.

In accordance with a concomitant feature of the invention, the resonant transformer is an autotransformer.

Simplified manufacturing conditions can thus be obtained from using the easier-to-produce autotransformer.

Under operating conditions with higher voltages and often concomitantly therewith, with a larger internal resistance, a parallel tuned circuit in the form of an untapped coil and a capacity is sufficient as the selective current sensor in the current path.

Other features which are considered as characteristic for the invention are set forth in the appended claims.

Although the invention is illustrated and described herein as embodied in an oscillation generator for an ultrasonic liquid atomizer, it is nevertheless not intended to be limited to the details shown, since various modifications and structural changes may be made therein without departing from the spirit of the invention and within the scope and range of equivalents of the claims.

Figure 2:
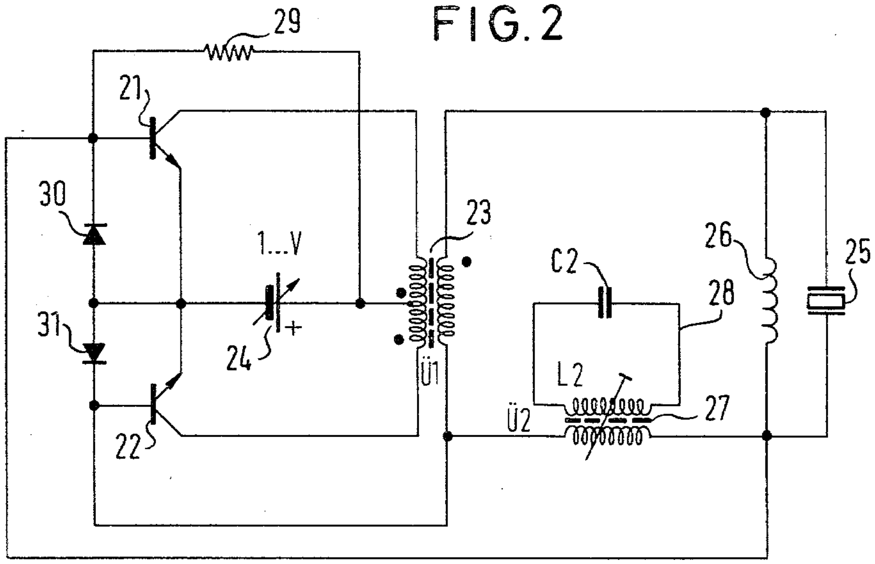

The construction and method of operation of the invention, however, together with addition objects and advantages thereof will be best understood from the following description of specific embodiments when read in connection with the accompanying drawings, in which:

FIG. 1 is a schematic circuit diagram of an oscillation generator for an ultrasonic liquid atomizer; and FIG. 2 is a schematic circuit diagram of a discrete oscillation generator for an ultrasonic liquid atomizer with low supply voltage.

Referring now to the figures of the drawing and first particularly to FIG. 1 thereof, there is seen an oscillation generator for an ultrasonic liquid atomizer. An amplifier 11 which comprises a difference input 12*a, b* and a difference output 13*a, b,* drives a selective load through a positive-feedback transformer 14. The selective load includes a piezoceramic atomizer element 15 with a vibrator, a matching choke 16 shunted thereto, a sensor in the form of a parallel circuit 18 which is connected in series with the parallel circuit of the two last-mentioned components and is coupled through a resonant transformer 17, and control lines of the positive feedback control voltage. The positive feedback control voltage is derived from the primary side of the resonant transformer 17, for the difference input 12 of the amplifier 11. The supply voltage, i.e. a battery or storage cell 19, is connected between the terminal 20*a* for the positive, and the terminal 20*b* for the negative supply voltage of the amplifier 11. The sense of the winding of the secondary side of the positive-feedback transformer 14 is chosen so that a positive feedback of the amplifier 11, exciting the oscillation, is generated through the tap of the tuned circuit. The atomizer resonance of the piezoceramic atomizer element 15 is adjusted through the adjustable inductivity of the parallel tuned circuit coupled through resonant transformer 17.

In FIG. 2, there is shown an oscillation generator for an ultrasonic liquid atomizer with an amplifier which includes two npn Si-transistors 21, 22 in a differential-amplifier arrangement. The collectors of the transistors 21, 22 are connected to the positive supply voltage 24 through a center-tapped primary winding of a positive-feedback transformer 23. On the secondary side, the positive feedback transformer 23 is loaded by a parallel circuit including an atomizer element 25 with a matching choke 26 and a sensor in the form of a parallel tuned circuit 28 which is connected in series therewith through a resonant transformer 27. The positive-feedback voltage is taken off across the primary winding of the resonant transformer 27 and is fed to the bases of the differential amplifier transistors 21, 22. The phase of this positive feedback voltage is determined by the sense of winding of the secondary winding of the positive-feedback transformer 23. The resistor 29 between the positive supply voltage terminal and the base of transistor 21 provides the base current necessary for starting the circuit of the differential amplifier. In operation, the differential amplifier itself establishes its base potential through diodes 30, 31 through rectification of part of the positive feedback voltage. At the same time, the drive of the bases is balanced with respect to the common emitter point by the respectively conducting diodes. The common emitter point of the differential amplifier is connected to the two anodes of the diodes 30 and 31, always poled between the emitter and the base of the transistors in the cutoff direction. The common emitter point is also tied to the negative terminal of the supply voltage 24 which can be as low as about 1 V.

Instead of coupling the parallel resonant circuit 28 by means of the resonant transformer 27, other arrangements are also conceivable; thus, an autotransformer can also be used instead of the transformer constructed with two separate windings. Likewise conceivable is an arrangement which uses a capacitive voltage divider instead of the inductive voltage divider. Furthermore, variants are possible for the starting resistor 29 which achieve the same purpose as the one in the example shown. Thus, the starting resistor can be divided into two symmetrical resistors which are associated with the respective bases; furthermore it can be attached as a single resistor 29 to any point of the circuit which is connected to the positive-feedback transformer on the secondary side and is metallically connected to the bases of the differential amplifier.

There are claimed:

1. Oscillation generator for an ultrasonic liquid atomizer, including an oscillator circuit, a push-pull amplifier with inputs and inductive positive feedback connected in said circuit, a piezoceramic atomizer vibrator element and a load-dependent regenerative feedback coupling connected to said circuit, said coupling comprising a parallel resonant tunable frequency-selective sensor element having outputs connected to said inputs of said amplifier.

2. Oscillation generator according to claim 1, wherein said amplifier inputs are difference inputs and said amplifier includes difference outputs and said sensor element is a parallel-resonance circuit, and including a positive-feedback transformer having a primary side connected as a balanced load to said outputs of said amplifier and a secondary side, and a selective circuit loading said secondary side of said positive-feedback transformer, said selective circuit including said piezoceramic atomizer element and a resonant transformer having a primary and secondary side, said parallel-resonance circuit being connected in series with said selective circuit and coupled to said resonance transformer, said difference inputs of said amplifier being driven by feedback voltage from across said primary side of said resonant transformer in push-pull for exciting the oscillation.

3. Oscillation generator according to claim 1 or 2, including a matching choke shunted across said atomizer element.

4. Oscillation generator according to claim 2, wherein the frequency of the generated oscillation is determined with band limitation by said parallel-resonance circuit and said parallel-resonance circuit is tuned to the atomizer frequency of said piezoceramic atomizer element.

5. Oscillation generator according to claim 2, wherein said amplifier is in the form of a differential amplifier circuit including two transistors, the collectors of said transistors forming said difference outputs connected across said primary side of said positive-feedback transformer, and said positive-feedback transformer having a center tap connected to a supply voltage.

6. Oscillation generator according to claim 5, including two diodes poled together in the cutoff direction against a fixed potential, said diodes being connected between the bases of said transistors for balancing said amplifier drive and for obtaining the base control current.

7. Oscillation generator according to claim 6, wherein the fixed potential is a supply voltage source, and including a common emitter point connected to the emitters of said transistors, to said supply voltage and to said diodes, and a series resistor connected between said supply voltage and the bases of said transistors which are driven in push-pull for supplying residual current to the bases.

8. Oscillation generator according to claim 7, wherein said supply voltage is at least in the order of 1 volt.

9. Oscillation generator according to claim 7, wherein said transistors are Si transistors.

10. Oscillation generator according to claim 2, wherein said resonant transformer is an autotransformer.

* * * * *